(12) United States Patent
Chambion et al.

(10) Patent No.: US 11,424,286 B2
(45) Date of Patent: Aug. 23, 2022

(54) WAFER-LEVEL PROCESS FOR CURVING A SET OF ELECTRONIC CHIPS

(71) Applicant: Commissariat a l'Energie Atomique et aux Energies Alternatives, Paris (FR)

(72) Inventors: Bertrand Chambion, Grenoble (FR); Jean-Philippe Colonna, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 214 days.

(21) Appl. No.: 16/937,752

(22) Filed: Jul. 24, 2020

(65) Prior Publication Data

US 2021/0028222 A1 Jan. 28, 2021

(30) Foreign Application Priority Data

Jul. 26, 2019 (FR) ...................................... 19 08529

(51) Int. Cl.
*H01L 27/00* (2006.01)
*H01L 27/146* (2006.01)
(Continued)

(52) U.S. Cl.
CPC .. *H01L 27/14687* (2013.01); *H01L 27/14621* (2013.01); *H01L 27/14627* (2013.01);
(Continued)

(58) Field of Classification Search
CPC ......... H01L 27/14632; H01L 27/14636; H01L 27/14687; H01L 27/14698; H01L 27/156; H01L 31/1892; H01L 33/58; H01L 33/62
See application file for complete search history.

(56) References Cited

U.S. PATENT DOCUMENTS

| 7,397,066 B2 * | 7/2008 | Oliver | H01L 27/14634 257/466 |
| 7,504,615 B2 * | 3/2009 | Farnworth | H01L 27/14683 257/434 |

(Continued)

OTHER PUBLICATIONS

French Preliminary Search Report dated Mar. 5, 2020 in French Application 19 08529 filed on Jul. 26, 2019 (with English Translation of Categories of Cited Documents & Written Opinion), 9 pages.

*Primary Examiner* — Mounir S Amer
*Assistant Examiner* — Alexander Belousov
(74) *Attorney, Agent, or Firm* — Oblon, McClelland, Maier & Neustadt, L.L.P.

(57) ABSTRACT

A wafer-level process includes providing a set of electronic chips, including a stack with a set of matrix arrays of pixels, an interconnect layer electrically connected to the set of matrix arrays of pixels, and a first layer, including vias electrically connected to the interconnect layer. The wafer-level process further includes forming metal pillars on the first layer, the pillars being electrically connected to the vias, and forming a material integrally with the first layer, around the metal pillars. The wafer-level process also includes dicing the electronic chips so as to release the thermomechanical stresses to which the stack is subjected. Finally, the wafer-level process includes making the metal pillars coplanar after dicing the electronic chips.

10 Claims, 3 Drawing Sheets

(51) Int. Cl.
  *H01L 27/15* (2006.01)
  *H01L 31/0392* (2006.01)
  *H01L 31/18* (2006.01)
  *H01L 33/00* (2010.01)
  *H01L 33/58* (2010.01)
  *H01L 33/62* (2010.01)

(52) U.S. Cl.
  CPC .. *H01L 27/14632* (2013.01); *H01L 27/14636* (2013.01); *H01L 27/14645* (2013.01); *H01L 27/14698* (2013.01); *H01L 27/156* (2013.01); *H01L 31/03926* (2013.01); *H01L 31/1892* (2013.01); *H01L 33/0095* (2013.01); *H01L 33/58* (2013.01); *H01L 33/62* (2013.01)

(56) References Cited

U.S. PATENT DOCUMENTS

| | | | | |
|---|---|---|---|---|
| 7,633,157 B2* | 12/2009 | Jiang | ................ | H01L 23/3128 |
| | | | | 438/126 |
| 7,923,793 B2* | 4/2011 | Choi | ................ | H01L 27/14618 |
| | | | | 257/415 |
| 9,853,078 B2* | 12/2017 | Yang | ................ | H01L 27/14632 |
| 9,998,643 B2* | 6/2018 | Sulfridge | ............ | H04N 5/2253 |
| 10,009,546 B2* | 6/2018 | Park | ................ | H04N 5/23296 |
| 10,020,347 B2* | 7/2018 | Enoki | .................. | H04N 5/369 |
| 10,304,880 B2* | 5/2019 | Kim | .................... | H01L 27/1462 |
| 10,361,235 B2* | 7/2019 | Yang | ................ | H01L 27/14607 |
| 10,418,408 B1* | 9/2019 | Zheng | ................ | H04N 5/3696 |
| 10,658,420 B2* | 5/2020 | Chambion | ........ | H01L 27/14607 |
| 10,818,587 B2* | 10/2020 | Seddon | ............. | H01L 21/67069 |
| 10,943,938 B2* | 3/2021 | Chiang | ............ | H01L 27/14687 |
| 2006/0038183 A1* | 2/2006 | Oliver | .............. | H01L 27/14636 |
| | | | | 257/79 |
| 2006/0275941 A1* | 12/2006 | Oliver | ................ | H01L 27/1464 |
| | | | | 438/57 |
| 2008/0237443 A1* | 10/2008 | Oliver | ................ | H01L 27/14636 |
| | | | | 250/200 |
| 2009/0115875 A1* | 5/2009 | Choi | .................... | H04N 5/2257 |
| | | | | 257/E31.127 |
| 2011/0037137 A1* | 2/2011 | Wehbe-Alause | ............................ | |
| | | | | H01L 27/14687 |
| | | | | 257/434 |
| 2017/0345861 A1* | 11/2017 | Yang | ................ | H01L 27/14618 |
| 2018/0204866 A1* | 7/2018 | Hsieh | ................ | H01L 27/14687 |
| 2021/0028222 A1* | 1/2021 | Chambion | ........ | H01L 27/14627 |
| 2021/0118940 A1* | 4/2021 | Chambion | ........ | H01L 27/14636 |

\* cited by examiner

WAFER-LEVEL PROCESS FOR CURVING A SET OF ELECTRONIC CHIPS

TECHNICAL FIELD

The invention relates to the technical field of wafer-level curving of electronic chips. By "wafer-level", what is meant is curving on the scale of the wafer on which the electronic chips are formed (Wafer-Level Process, WLP).

The invention is notably applicable in the fabrication of curved image sensors or curved displays able to be integrated into an optical system (e.g. a camera objective) in order to increase the compactness of the optical system, or to improve the optical performance thereof (e.g. in order to compensate for field curvature or astigmatism).

PRIOR ART

One wafer-level process for curving electronic chips that is known in the prior art, and notably from document US 2006/0038183 A1 (D1 below), comprises a step consisting in arranging flexor units to curve the electronic chips.

In particular, D1 discloses (FIG. 5, paragraphs 0035-36) flexor units arranged under the substrate (backside) comprising the electronic chips to be curved, each unit comprising:
- a central element, formed under the substrate;
- spacers, lying on either side of the central element and formed under the substrate;
- a plate, connecting the central element to the spacers.

The spacers and the central element possess different coefficients of thermal expansion so that, by applying a heat treatment, it is possible to curve the substrate, and thus the electronic chips.

Moreover, D1 discloses (FIG. 8, paragraph 0039) flexor units arranged under the substrate (backside) comprising the electronic chips to be curved, each unit comprising:
- a first material, formed under the substrate;
- a second material, formed under the first material.

The first and second materials possess different coefficients of thermal expansion so that, by applying a heat treatment, it is possible to curve the substrate, and thus the electronic chips.

A prior-art process of this kind is not entirely satisfactory insofar as the flexor units complexify the implementation of the process, because it is necessary to provide a plurality of additional structural elements (spacers, plates). Furthermore, the flexor units increase the processing time since the steps of curving and singulating the electronic chips are executed separately, the curving being performed before the electronic chips are singulated. Lastly, the presence of flexor units prevents electrical contacts from being easily produced on the backside of the substrate with a view to forming an electrical connection to a package or a circuit board.

DESCRIPTION OF THE INVENTION

The invention aims to remedy all or some of the aforementioned drawbacks.

To this end, the subject of the invention is a wafer-level process for curving a set of electronic chips, comprising the steps of:
a) providing the set of electronic chips, comprising a stack including:
   - a set of matrix arrays of pixels,
   - an interconnect layer electrically connected to the set of matrix arrays of pixels,
   - a first layer, comprising vias electrically connected to the interconnect layer; the stack possessing a first thickness and a first coefficient of thermal expansion;
b) forming metal pillars on the first layer, said pillars being electrically connected to the vias;
c) forming a material integrally with the first layer, around the metal pillars; the material possessing a second thickness, a second coefficient of thermal expansion strictly higher than the first coefficient of thermal expansion, and a forming temperature;
d) dicing the electronic chips so as to release the thermomechanical stresses to which the stack is subjected; the forming temperature, the ratio between the first and second coefficients of thermal expansion and the ratio between the first and second thicknesses being chosen so that, at the end of step d), the stack is curved with a predefined convex shape that is oriented toward the set of matrix arrays of pixels, at a given operating temperature of the electronic chips;
e) making the metal pillars coplanar after step d).

Thus, such a process according to the invention allows the curving to be performed during the singulation of the electronic chips, i.e. during the dicing of step d), which releases the thermomechanical stresses to which the stack is subjected. This is made possible by virtue of the material formed integrally with the stack. Furthermore, such a process according to the invention only requires material to be formed on the stack, and therefore no additional structural elements such as spacer-linking plates. Lastly, the coplanarity of the metal pillars, which is obtained in step e), allows co-planar electrical contacts to be easily produced on the metal pillars, in order to form an electrical connection to a package or a circuit board (for example using solder bumps). The vias of the first layer allow an electrical connection to be obtained, and moreover improve the mechanical cohesion of the stack by decreasing the risks of delamination.

Definitions

By "electronic chip", what is meant is a portion of a substrate having undergone technological steps with a view to forming an electronic component intended to be mounted on a circuit board or in a package.

By "substrate", what is meant is a self-supporting physical carrier, which may for example be a wafer cut from a single-crystal semiconductor ingot.

By "pixels", what is meant is:
photosensitive cells (also called photosites) in the case of an electronic chip of an image sensor, light-emitting (or emissive) cells in the case of an electronic chip of a display.

By "interconnect layer", what is meant is a stack of interconnect levels comprising metal tracks embedded in a dielectric.

By "via", what is meant is a metallized hole allowing an electrical connection to be made to the interconnect layer. In the case where the first layer is made of silicon, the via is a TSV (acronym of Through Silicon Via).

By "formed integrally", what is meant is that the material is mechanically integral with the first layer of the stack, i.e. the material has a sufficient adhesion energy to obtain the curvature and to avoid it debonding from the stack.

By "release the thermomechanical stresses", what is meant is the fact of converting the thermomechanical stresses to which the stack is subjected into deformation (curvature).

By "predefined", what is meant is the convex shape desired for the envisaged application.

By "oriented towards the set of matrix arrays of pixels", what is meant is that the convex shape obtained at the end of step d) defines, within the stack, convex (curved) surfaces that point toward the free surface of the stack, on the side of the set of matrix arrays of pixels, opposite the metal pillars.

By "coplanar", what is meant is that the free ends of the metal pillars lie in the same plane with a tolerance of 100 µm, preferably of 50 µm, and more preferably of 25 µm. The tolerance corresponds to the maximum distance between the plane and a free end of a metal pillar. Advantageously, a tolerance lower than one quarter of the characteristic dimension (e.g. diameter) of the solder bumps intended to ensure an electrical connection between the metal pillars and a package (or a circuit board) will be chosen. For example, for solder bumps possessing a diameter of 100 µm, the tolerance is lower than 25 µm.

The process according to the invention may comprise one or more of the following features.

According to one feature of the invention, step e) is executed so that the metal pillars lie flush with the material.

One advantageous effect thereof is to avoid wetting the flanks of the metal pillars during the subsequent formation of solder bumps.

According to one feature of the invention, step e) is executed via mechanical or chemical-mechanical polishing of the metal pillars.

Step e) may be preceded by a grinding step if a large thickness of the metal pillars is to be polished, in order to limit the processing time.

According to one feature of the invention, the process comprises a step f) consisting in forming solder bumps in contact with the metal pillars at the end of step e).

The term "solder bump" covers both the case where the solder is the same as the materials to be assembled, and the case where it is different from each thereof.

One advantageous effect thereof is to allow an electrical connection to be made to a circuit board (or to a package).

According to one feature of the invention, step a) comprises the steps of:
a₁) providing a first substrate on which is formed the set of electronic chips;
a₂) assembling a temporary substrate with the set of electronic chips;
a₃) thinning the first substrate until the first layer is obtained;
a₄) forming vias in the first layer.

One advantageous effect of the thinning of the first substrate is to promote the curving of the electronic chips in step d).

According to one feature of the invention, step a) is executed so that:
the interconnect layer is formed on the first layer;
the set of matrix arrays of pixels is formed on the interconnect layer;
the stack comprises a set of matrix arrays of focusing lenses, which is formed on the set of matrix arrays of pixels.

Thus, a BSI image sensor (BSI being the acronym of Back Side Illuminated) is obtained. The incident light penetrates into the set of matrix arrays of pixels, which is located upstream of the interconnect layer, thereby avoiding the loss of energy and thus increasing the sensitivity of the image sensor.

According to one feature of the invention, step a) is executed so that:
the set of matrix arrays of pixels is formed on the first layer;
the interconnect layer is formed on the set of matrix arrays of pixels;
the stack comprises a set of matrix arrays of focusing lenses, which is formed on the interconnect layer.

Thus, an FSI image sensor (FSI being the acronym of Front Side Illuminated) is obtained. The incident light penetrates via the interconnect layer and the set of matrix arrays of pixels is located downstream of the interconnect layer.

According to one feature of the invention, step a) is executed so that the material is a thermosetting polymer preferably chosen from an epoxy resin and a polysiloxane resin.

One advantageous effect thereof is to be able to mould the material using an injection mould.

According to one feature of the invention, step a) is executed so that the first and second coefficients of thermal expansion respect:

$$\frac{\alpha_2}{\alpha_1} \geq 4,$$

and preferably $$\frac{\alpha_2}{\alpha_1} \geq 6,$$

where
$\alpha_1$ is the coefficient of thermal expansion of the stack,
$\alpha_2$ is the coefficient of thermal expansion of the material.

One advantageous effect thereof is to permit the convex shape and thus the electronic chips to have high radii of curvature. The radius of curvature may be calculated depending on $\alpha_1$ and $\alpha_2$ using the Stoney formula.

According to one feature of the invention, step a) is executed so that the material possesses a Young's modulus higher than 100 MPa, preferably higher than 1 GPa, and more preferably higher than 3 GPa.

One advantageous effect thereof is to obtain a material of satisfactory stiffness, permitting the stack to be curved with the desired curvature in step d).

BRIEF DESCRIPTION OF THE DRAWINGS

Other features and advantages will become apparent from the detailed description of various embodiments of the invention, the description containing examples and references to the appended drawings.

Figure 1A:
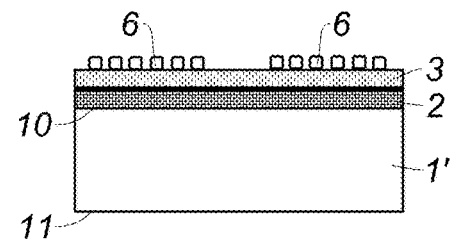
FIGS. 1a to 1k are schematic cross-sectional views illustrating a first mode of implementation of a process according to the invention for an FSI image sensor.

It will be noted that the drawings described above are schematic and are not to scale for the sake of legibility and to simplify comprehension thereof.

DETAILED DESCRIPTION OF EMBODIMENTS

Elements that are identical or that perform the same function will be designated with the same references in the various embodiments, for the sake of simplicity.

The subject of the invention is a wafer-level process for curving a set of electronic chips P, comprising the steps of:
 a) providing the set of electronic chips P, comprising a stack including:
  a set of matrix arrays of pixels 2,
  an interconnect layer 3 electrically connected to the set of matrix arrays of pixels 2,
  a first layer 1, comprising vias 100 electrically connected to the interconnect layer 3;
  the stack possessing a first thickness and a first coefficient of thermal expansion;
 b) forming metal pillars 4 on the first layer 1, said pillars being electrically connected to the vias 100;
 c) forming a material 5 integrally with the first layer 1, around the metal pillars 4; the material 5 possessing a second thickness, a second coefficient of thermal expansion strictly higher than the first coefficient of thermal expansion, and a forming temperature;
 d) dicing the electronic chips P so as to release the thermomechanical stresses to which the stack is subjected; the forming temperature, the ratio between the first and second coefficients of thermal expansion and the ratio between the first and second thicknesses being chosen so that, at the end of step d), the stack is curved with a predefined convex shape that is oriented towards the set of matrix arrays of pixels 2, at a given operating temperature of the electronic chips P;
 e) making the metal pillars 4 coplanar after step d).

First Layer

The first layer 1 comprises first and second opposite surfaces 10, 11. The first layer 1 is advantageously obtained from a first substrate 1' thinned in order to promote the curving of the electronic chips P. The first layer 1 advantageously has a thickness smaller than 500 µm, preferably smaller than 100 µm, and more preferably smaller than 50 µm. Such a thickness range allows the curving in step d) to be promoted. The first layer 1 is advantageously made from a semiconductor, and preferably silicon. In the case where the first layer 1 is made of silicon, the vias 100 are TSVs (Through Silicon Vias).

FSI Image Sensor

Step a) may be executed so that:
 the set of matrix arrays of pixels 2 is formed on the first layer 1;
 the interconnect layer 3 is formed on the set of matrix arrays of pixels 2;
 the stack comprises a set of matrix arrays of focusing lenses 6, which is formed on the interconnect layer 3.

More precisely, the set of matrix arrays of pixels 2 is formed at the first surface 10 of the first layer 1. The metal pillars 4 are formed, in step b), at the second surface 11 of the first layer 1. By "formed at the surface", what is meant is formed on or through the surface.

Thus, when the electronic chips P are FSI image sensors (FSI being the acronym of Front Side Illuminated), the incident light penetrates via the interconnect layer 3 and the set of matrix arrays of pixels 2 is located downstream of the interconnect layer 3.

It will be noted that the matrix arrays of focusing lenses 6 may be optional in certain types of sensors, notably cooled infrared sensors.

BSI Image Sensor

Step a) may be executed so that:
 the interconnect layer 3 is formed on the first layer 1;
 the set of matrix arrays of pixels 2 is formed on the interconnect layer 3;
 the stack comprises a set of matrix arrays of focusing lenses 6, which is formed on the set of matrix arrays of pixels 2.

More precisely, the interconnect layer 3 is formed at the first surface 10 of the first layer 1. The metal pillars 4 are formed, in step b), at the second surface 11 of the first layer 1. By "formed at the surface", what is meant is formed on or through the surface.

Thus, when the electronic chips P are BSI image sensors (BSI being the acronym of Back Side Illuminated), the incident light penetrates into the set of matrix arrays of pixels 2, which is located upstream of the interconnect layer 3, thereby avoiding the loss of energy and thus increasing the sensitivity of the image sensor.

It will be noted that the matrix arrays of focusing lenses 6 may be optional in certain types of sensors, notably cooled infrared sensors.

Interconnect Layer

The interconnect layer 3 is a stack of interconnect levels comprising metal tracks embedded in a dielectric. By way of non-limiting example, the metal tracks may be made from copper or from aluminium, and the dielectric may be organic (a polymer such as a polyimide, or ALX, which is sold by ASAHI GLASS) or inorganic ($SiO_2$, SiN, etc.). The interconnect layer 3 may be an electrical-connection RDL (Re-Distribution Layer) within an interposer.

Matrix Arrays of Pixels

The pixels 2 may be photosensitive cells (also called photosites) in the case of an electronic chip P of an image sensor. The pixels 2 may be light-emitting (or emissive) cells in the case of an electronic chip P of a display.

Figure 3:
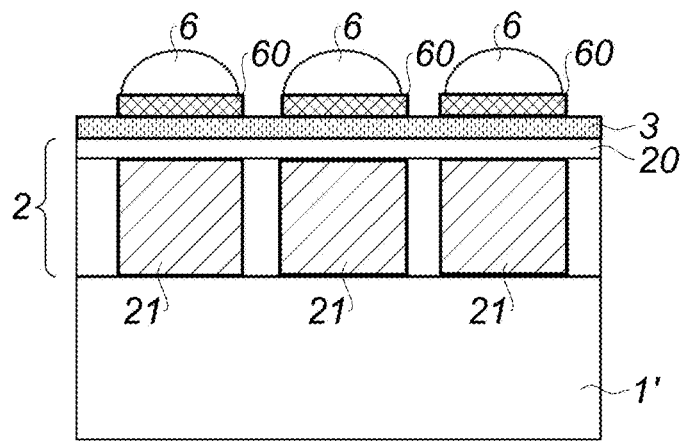
FIG. 3 is a partial schematic cross-sectional view of an FSI image sensor provided in step a) of a process according to the invention.
Figure 4:
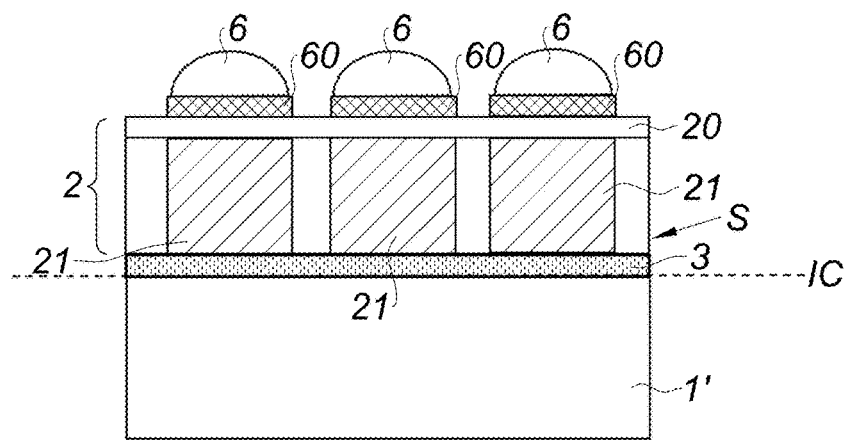
FIG. 4 is a partial schematic cross-sectional view of a BSI image sensor provided in step a) of a process according to the invention. The dashed lines designate the bonding interface.
Figure 5:
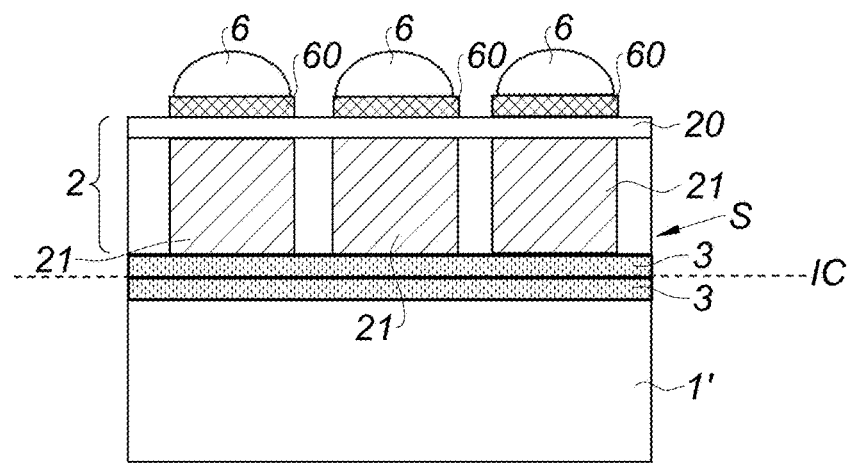
FIG. 5 is a partial schematic cross-sectional view of a 3D stacked BSI image sensor provided in step a) of a process according to the invention. The dashed lines designate the bonding interface.

As illustrated in FIGS. 3 to 5, when the electronic chip P is an image sensor, the matrix arrays of pixels 2 are advantageously equipped with photodiodes 21 linked to the surface 20 that receives the incident light. The matrix arrays of pixels 2 are advantageously equipped with CMOS circuits (CMOS being the acronym of Complementary Metal-Oxide-Semiconductor) configured to process the electrical signal generated by the photodiodes 21 (amplification of the signal, selection of the pixel, etc.).

When the electronic chip P is a display, the matrix arrays of pixels 2 are advantageously equipped with light-emitting diodes (not illustrated). The matrix arrays of pixels 2 are advantageously equipped with CMOS circuits configured to control the light-emitting diodes.

As illustrated in FIGS. 3 to 5, the matrix arrays of pixels 2 are advantageously equipped with colour filters 60. When the electronic chip P is an image sensor, the colour filters 60 are advantageously arranged to form a Bayer filter. The colour filters 60 are interposed between the surface 20 that receives the incident light and the matrix arrays of focusing lenses 6.

Matrix Arrays of Focusing Lenses

In the case of an electronic chip P of an image sensor comprising matrix arrays of focusing lenses 6, the focusing lenses 6 are convergent so as to concentrate the incident light towards the matrix arrays of pixels 2. Each focusing lens 6 is associated with one pixel. The focusing lenses 6 are preferably microlenses.

Material

The material 5 is mechanically integral with the first layer 1 of the stack. To this end, the material 5 is chosen so as to have a high enough adhesion energy to obtain the curvature and to avoid it debonding from the stack at the given operating temperature of the electronic chips P.

The first and second coefficients of thermal expansion are advantageously chosen so that:

$$\frac{\alpha_2}{\alpha_1} \geq 4,$$

and preferably so that $$\frac{\alpha_2}{\alpha_1} \geq 6,$$

$\alpha_1$ is the coefficient of thermal expansion of the stack,
$\alpha_2$ is the coefficient of thermal expansion of the material 5.

It is possible to measure the coefficient of thermal expansion of the stack using a technique known to those skilled in the art, as described in chapter 2 of the document "*ASM Ready Reference: Thermal Properties of Metals*", ASM International, 2002, or even in document B. Cassel et al., "*Coefficient of Thermal Expansion Measurement using the TMA 4000*", PerkinElmer, Inc., 2013.

To a first approximation, the coefficient of thermal expansion of the stack is substantially equal to the coefficient of thermal expansion of the first layer 1 insofar as the thickness of the first layer 1 is predominant in the stack. When the first layer 1 is made of silicon, $\alpha_1$ is about $2.5 \times 10^{-6}$ $K^{-1}$. A material 5 with $\alpha_2$ such that $\alpha_2$ $1 \times 10^{-5}$ $K^{-1}$, and preferably $\alpha_2 \geq 1.5 \times 10^{-6}$ $K^{-1}$ will therefore be chosen. The radius of curvature obtained at the end of step d) may be calculated depending on $\alpha_1$ and $\alpha_2$ using the Stoney formula, which is known to those skilled in the art.

The material 5 advantageously possesses a Young's modulus higher than 100 MPa, preferably higher than 1 GPa, and more preferably higher than 3 GPa.

The material 5 advantageously has a second thickness comprised between 120 μm and 600 μm. The material 5 may be single-layered or multi-layered. To a first approximation, the ratio between the first thickness (of the stack) and the second thickness (of the material 5), which influences the curvature of the convex shape, may be considered to be governed by the ratio between the thickness of the first layer 1 and the second thickness insofar as the thickness of the first layer 1 is predominant in the stack. Preferably, a second thickness of about 2.5 times larger than the thickness of the first layer 1 will be chosen for the material 5 when the first layer 1 is made of silicon, in order to optimize the curvature of the convex shape depending on the envisaged application. When the material 5 is polished in step e), the second thickness of the polished material 5 is advantageously at least 2 times larger than the thickness of the first layer 1 when the first layer 1 is made of silicon. Thus, the curvature of the convex shape is not greatly affected in step e).

Step a) may be executed so that the material 5 is a thermosetting polymer, preferably chosen from an epoxy resin and a polysiloxane resin. Where appropriate, the second coefficient of thermal expansion is the coefficient of thermal expansion of the set polymer. By way of non-limiting example, the thermosetting polymer may be:
 an epoxy resin with a Young's modulus of about 9 GPa, $\alpha_2$ comprised between $3.1 \times 10^{-5}$ $K^{-1}$ and $1.14 \times 10^{-4}$ $K^{-1}$, and a cross-linking temperature of about 71° C.;
 a polysiloxane resin with a Young's modulus of about 3.3 GPa, $\alpha_2$ comprised between $2 \times 10^{-5}$ $K^{-1}$ and $9.1 \times 10^{-5}$ $K^{-1}$, and a cross-linking temperature of about 180° C.

The thermosetting polymer possesses a forming temperature (e.g. cross-linking temperature) strictly higher than the given operating temperature of the electronic chips P.

Metal Pillars

The metal pillars 4 are preferably made of aluminium or copper.

For example, a metal seed layer may be deposited on the first layer 1.

The seed layer allows wafer-level electrical contact to be made for the future electrodeposition of the metal pillars 4. The seed layer may have a thickness of about 300 nm. Next, a photoresist may be deposited on the seed layer, then exposed to ultraviolet light through a mask so as to form patterns delineating the future metal pillars 4. The thickness of the photoresist is chosen so as to be equal to the height of the future metal pillars 4. The seed layer is then biased in a dedicated bath allowing the electrodeposition of the metal pillars 4. Lastly, the photoresist is removed, and the portion of the seed layer that lay under the photoresist during the electrodeposition is etched away.

Dicing of Step d)

By way of non-limiting example, step d) may be executed using a precision circular saw with a metal cutting blade or diamond-impregnated resinoid cutting blade.

Predefined Convex Shape

The predefined convex shape may have a constant or variable (of given sign) radius of curvature. The predefined convex shape may be aspherical. The (constant or variable) radius of curvature is preset depending on the envisaged application.

Step e) of Generating the Coplanarity

Step e) may be executed via mechanical or chemical-mechanical polishing of the metal pillars 4.

Step e) is advantageously executed so that the metal pillars 4 lie flush with the material 5 at the end of step e). Step e) may be accompanied by polishing of the material 5, depending on the thickness of the metal pillars 4 protruding from the material 5.

The process advantageously comprises a step f) consisting in forming solder bumps BS in contact with the metal pillars 4 at the end of step e).

Application to the FSI Image Sensor

This mode of implementation is illustrated in FIGS. 1*a* to 1*k*.

Step a) is executed so that:
 the interconnect layer 3 is formed at the first surface 10 of the first layer 1;
 the set of matrix arrays of pixels 2 is formed on the interconnect layer 3;
 the stack comprises a set of matrix arrays of focusing lenses 6, which is formed on the set of matrix arrays of pixels 2.

Figure 1B:
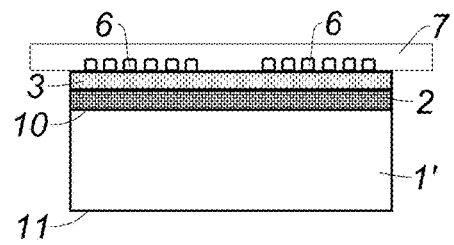
Figure 1D:
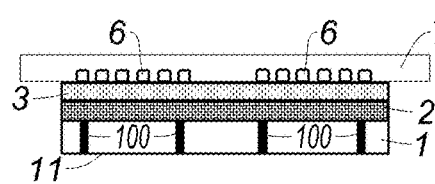
Figure 1C:
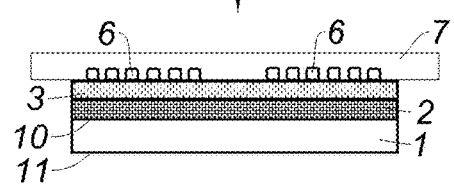

Step a) may comprise the steps of:

$a_1$) providing a first substrate 1', on which is formed the set of electronic chips P;

$a_2$) assembling a temporary substrate 7 with the set of electronic chips P (illustrated in FIG. 1b);

$a_3$) thinning the first substrate 1' until the first layer 1 is obtained (illustrated in FIG. 1c);

$a_4$) forming the vias 100 in the first layer 1 (illustrated in FIG. 1d).

Step $a_2$) is executed so that the temporary substrate 7 is assembled with the interconnect layer 3. By way of non-limiting example, the temporary substrate 7 assembled in step $a_2$) may be an adhesive film, arranged on the side of the interconnect layer 3 and held by a vacuum chuck. Use of the temporary substrate 7 permits the first substrate 1' to be thinned, in order to ensure the stack behaves mechanically as desired.

Step $a_3$) is preferably executed via chemical-mechanical polishing, preceded by grinding.

As illustrated in FIG. 1d, step $a_4$) consists in forming vias 100 passing through the first layer 1, said vias being electrically connected to the interconnect layer 3.

Figure 1E:
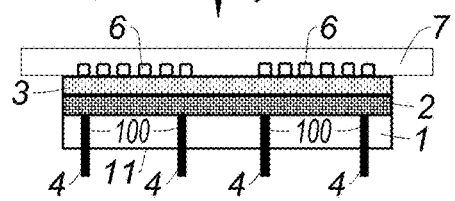

As illustrated in FIG. 1e, the metal pillars 4 are formed, in step b), at the second surface 11 of the first layer 1, in contact with the vias 100, for example using the technique described above in the section entitled "Metal pillars".

Figure 1F:
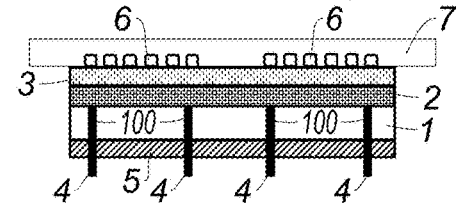

As illustrated in FIG. 1f, the material 5 is formed on the second surface 11 of the first layer 1, in step c), integrally with the stack, around the metal pillars 4. Step c) may be executed via a conformal deposition.

Figure 1H:
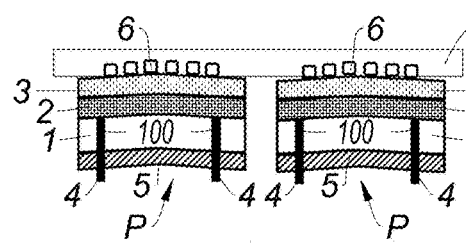
Figure 1G:
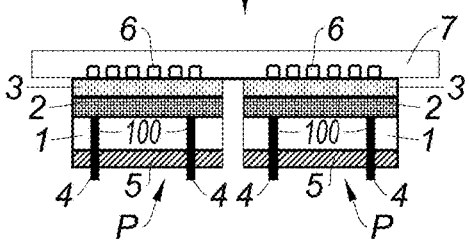

Step d) of dicing is illustrated in FIG. 1g and the release of the thermomechanical stresses to which the stack is subjected is illustrated in FIG. 1h. It will be noted that the deformations undergone in step d) by the temporary substrate 7 are not illustrated in FIG. 1h. Because of the surface topology of the temporary substrate 7, at the end of step d), a handle (not illustrated) is assembled with the temporary substrate 7 before step e), using a particular technique, such as the CONDOx process known to those skilled in the art, and notably described in document US 2017/0062278. The handle may comprise a UV-curable resin (e.g. the resin ResiFlat sold by DISCO Corporation or the resin Temploc sold by DENKA) assembled with the temporary substrate 7 via a protective film. The resin is assembled with the protective film by virtue of a carrier that ensures the resin behaves mechanically as desired, the carrier possibly being made of glass or of polyethylene terephthalate (PET). The handle may be subsequently removed from the temporary substrate 7 by firstly removing the resin and the carrier, and then by secondly removing the protective film via a suitable process, for example using ultraviolet light or a chemical agent.

Figure 1I:
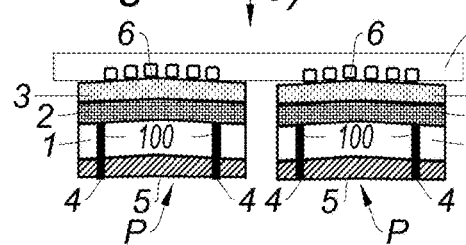

As illustrated in FIG. 1i, step e) may be executed via chemical-mechanical polishing of the metal pillars 4. Step e) may be preceded by grinding if the thickness of the metal pillars 4 to be polished is large, in order to limit the processing time.

Figure 1J:
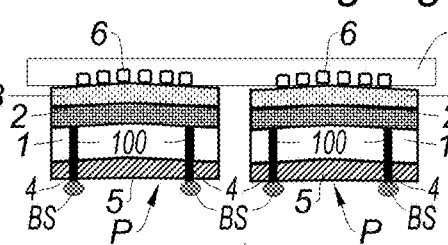

As illustrated in FIG. 1j, the process may comprise a step f) consisting in forming solder bumps BS in contact with the metal pillars 4 at the end of step e).

Figure 1K:
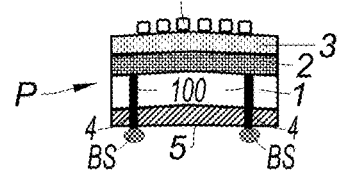

Lastly, as illustrated in FIG. 1k, the temporary substrate 7 is removed in a step g) in order to mount the electronic chips P on a circuit board or in a package.

Application to the BSI Image Sensor

This mode of implementation is illustrated in FIGS. 2a to 2k.

Step a) is executed so that:

the interconnect layer 3 is formed at the first surface 10 of the first layer 1;

the set of matrix arrays of pixels 2 is formed on the interconnect layer 3;

the stack comprises a set of matrix arrays of focusing lenses 6, which is formed on the set of matrix arrays of pixels 2.

Figure 2A:
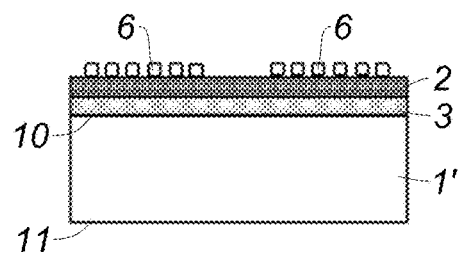
FIGS. 2a to 2k are schematic cross-sectional views illustrating a first mode of implementation of a process according to the invention for a BSI image sensor.
Figure 2B:
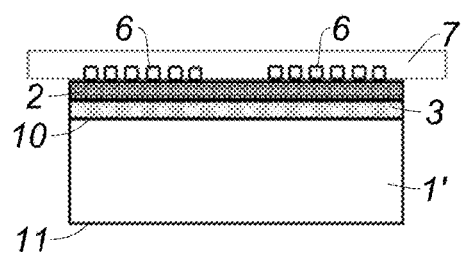
Figure 2C:
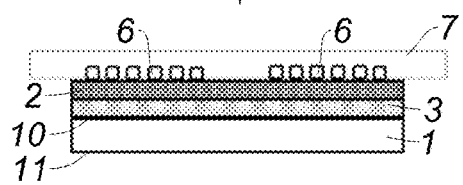
Figure 2D:
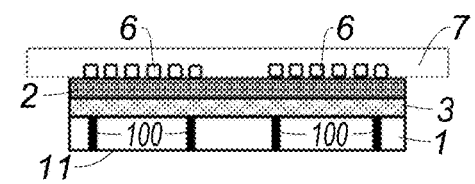

Step a) may comprise the steps of:

$a_1$) providing a first substrate 1', on which is formed the set of electronic chips P;

$a_2$) assembling a temporary substrate 7 with the set of electronic chips P (illustrated in FIG. 2b);

$a_3$) thinning the first substrate 1' until the first layer 1 is obtained (illustrated in FIG. 2c);

$a_4$) forming the vias 100 in the first layer 1 (illustrated in FIG. 2d).

As illustrated in FIGS. 4 and 5, the set of electronic chips P may be formed before step $a_1$) in a substrate S that is then bonded to the first substrate 1'. The dashed lines designate the bonding interface IC. As illustrated in FIG. 5, the first substrate 1' may be equipped with a read circuit capable of simultaneously reading each pixel of a matrix array formed in the substrate S.

Step $a_2$) is executed so that the temporary substrate 7 is assembled with the set of matrix arrays of pixels 2. By way of non-limiting example, the temporary substrate 7 assembled in step $a_2$) may be an adhesive film, arranged on the side of the set of matrix arrays of pixels 2 and held by a vacuum chuck. Use of the temporary substrate 7 permits the first substrate 1' to be thinned, in order to ensure the stack behaves mechanically as desired.

Step $a_3$) is preferably executed via chemical-mechanical polishing, preceded by grinding.

As illustrated in FIG. 2d, step $a_4$) consists in forming vias 100 passing through the first layer 1, said vias being electrically connected to the interconnect layer 3.

Figure 2E:
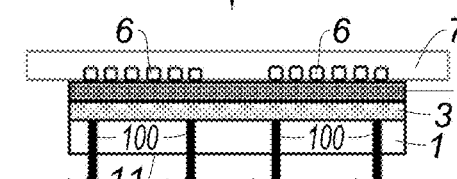

As illustrated in FIG. 2e, the metal pillars 4 are formed, in step b), at the second surface 11 of the first layer 1, in contact with the vias 100, for example using the technique described above in the section entitled "Metal pillars".

Figure 2F:
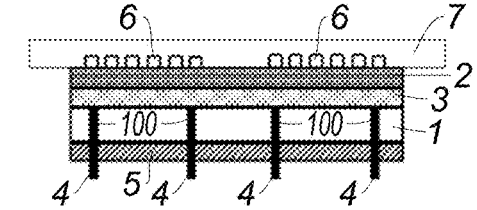

As illustrated in FIG. 2f, the material 5 is formed on the second surface 11 of the first layer 1, in step c), integrally with the stack, around the metal pillars 4. Step c) may be executed via a conformal deposition.

Figure 2G:
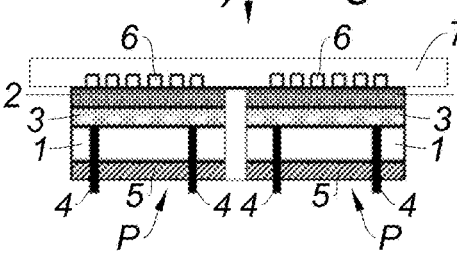
Figure 2H:
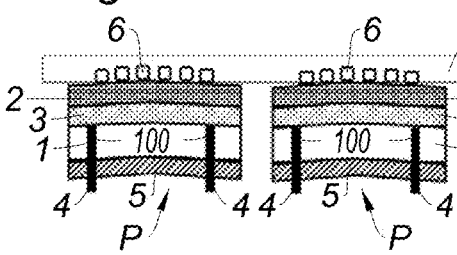

Step d) of dicing is illustrated in FIG. 2g and the release of the thermomechanical stresses to which the stack is subjected is illustrated in FIG. 2h. It will be noted that the deformations undergone in step d) by the temporary substrate 7 are not illustrated in FIG. 2h. Because of the surface topology of the temporary substrate 7, at the end of step d), a handle (not illustrated) is assembled with the temporary substrate 7 before step e), using a particular technique, such as the CONDOx process known to those skilled in the art, and notably described in document US 2017/0062278 (see the preceding paragraph for more detail on the modalities of implementation).

Figure 2I:
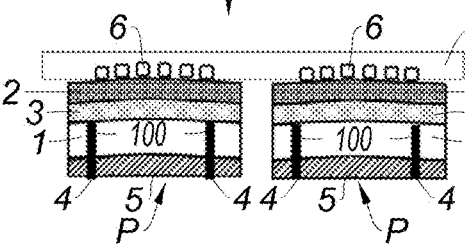

As illustrated in FIG. 2i, step e) may be executed via chemical-mechanical polishing of the metal pillars 4. Step e) may be preceded by grinding if the thickness of the metal pillars 4 to be polished is large, in order to limit the processing time.

Figure 2J:
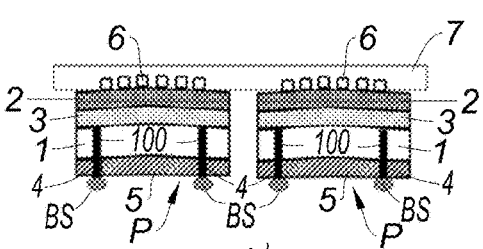

As illustrated in FIG. 2j, the process may comprise a step f) consisting in forming solder bumps BS in contact with the metal pillars 4 at the end of step e).

Figure 2K:
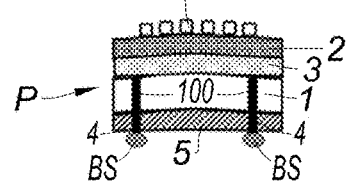

Lastly, as illustrated in FIG. 2k, the temporary substrate 7 is removed in a step g) in order to mount the electronic chips P on a circuit board or in a package.

The invention is not limited to the described embodiments. Those skilled in the art will be able to consider technically operable combinations thereof, and to substitute equivalents therefor.

The invention claimed is:

1. A wafer-level process for curving a set of electronic chips, comprising:
   providing the set of electronic chips, comprising a stack including:
      a set of matrix arrays of pixels,
      an interconnect layer electrically connected to the set of matrix arrays of pixels,
      a first layer, comprising vias electrically connected to the interconnect layer;
   the stack possessing a first thickness and a first coefficient of thermal expansion;
   forming metal pillars on the first layer, said pillars being electrically connected to the vias;
   forming a material integrally with the first layer, around the metal pillars; the material possessing a second thickness, a second coefficient of thermal expansion strictly higher than the first coefficient of thermal expansion, and a forming temperature;
   dicing the electronic chips so as to release the thermomechanical stresses to which the stack is subjected; the forming temperature, the ratio between the first and second coefficients of thermal expansion and the ratio between the first and second thicknesses being chosen so that, at the end of the dicing the electronic chips, the stack is curved with a predefined convex shape that is oriented towards the set of matrix arrays of pixels, at a given operating temperature of the electronic chips;
   making the metal pillars coplanar after the dicing the electronic chips.

2. The process according to claim 1, wherein the making the metal pillars is executed so that the metal pillars lie flush with the material.

3. The process according to claim 1, wherein the making the metal pillars is executed via mechanical or chemical-mechanical polishing of the metal pillars.

4. The process according to claim 1, comprising forming solder bumps in contact with the metal pillars at the end of the making the metal pillars.

5. The process according to claim 1, wherein the providing the set of electronic chips comprises:
   providing a first substrate on which is formed the set of electronic chips;
   assembling a temporary substrate with the set of electronic chips;
   thinning the first substrate until the first layer is obtained;
   forming the vias in the first layer.

6. The process according to claim 1, wherein the providing the set of electronic chips is executed so that:
   the interconnect layer is formed on the first layer;
   the set of matrix arrays of pixels is formed on the interconnect layer;
   the stack comprises a set of matrix arrays of focusing lenses, which is formed on the set of matrix arrays of pixels.

7. The process according to claim 1, wherein the providing the set of electronic chips is executed so that:
   the set of matrix arrays of pixels is formed on the first layer;
   the interconnect layer is formed on the set of matrix arrays of pixels;
   the stack comprises a set of matrix arrays of focusing lenses, which is formed on the interconnect layer.

8. The process according to claim 1, wherein the providing the set of electronic chips is executed so that the material is a thermosetting polymer preferably chosen from an epoxy resin and a polysiloxane resin.

9. The process according to claim 1, wherein the providing the set of electronic chips is executed so that the first and second coefficients of thermal expansion respect:

$$\frac{\alpha_2}{\alpha_1} \geq 4,$$

and preferably $$\frac{\alpha_2}{\alpha_1} \geq 6,$$

where:
   $\alpha_1$ is the coefficient of thermal expansion of the stack,
   $\alpha_2$ is the coefficient of thermal expansion of the material.

10. The process according to claim 1, wherein the providing the set of electronic chips is executed so that the material possesses a Young's modulus higher than 3 GPa.

* * * * *